United States Patent
McCaslin et al.

(10) Patent No.: US 8,434,223 B2
(45) Date of Patent: May 7, 2013

(54) METHOD FOR MANUFACTURING A SUBSTRATE SUPPORTING AN INTEGRATED CIRCUIT CHIP

(75) Inventors: Martin John McCaslin, Pleasanton, CA (US); Szu-Han Hu, Pathumthani (TH); Alex Enriquez Cayaban, Fremont, CA (US); Voon Yee Ho, Singapore (SG)

(73) Assignee: Nitto Denko Corporation, Osaka (JP)

(*) Notice: Subject to any disclaimer, the term of this patent is extended or adjusted under 35 U.S.C. 154(b) by 0 days.

(21) Appl. No.: 13/487,435

(22) Filed: Jun. 4, 2012

(65) Prior Publication Data

US 2012/0238072 A1 Sep. 20, 2012

Related U.S. Application Data

(60) Division of application No. 13/214,120, filed on Aug. 19, 2011, now Pat. No. 8,213,125, which is a continuation of application No. 11/548,681, filed on Oct. 11, 2006, now abandoned.

(51) Int. Cl.
*H01R 43/00* (2006.01)
(52) U.S. Cl.
USPC .......... 29/884; 29/854; 29/874; 29/876; 29/877
(58) Field of Classification Search .......... 29/884, 29/854, 874, 876, 877; 257/659, 660, 734, 257/737, 738, E21.599, E23.177; 361/719, 361/749, 760, 767, 783, 816, 818, 820
See application file for complete search history.

(56) References Cited

U.S. PATENT DOCUMENTS

| | | | |
|---|---|---|---|
| 5,488,254 A | 1/1996 | Nishimura et al. | |
| 5,499,161 A | 3/1996 | Hosseinzadeh et al. | |
| 5,620,928 A | 4/1997 | Lee et al. | |
| 5,907,452 A | 5/1999 | Kan | |
| 6,109,530 A | 8/2000 | Larson et al. | |
| 6,166,888 A | 12/2000 | Tsuda et al. | |
| 6,208,521 B1* | 3/2001 | Nakatsuka | 361/749 |
| 6,336,367 B1 | 1/2002 | Raisanen | |
| 6,480,362 B1 | 11/2002 | Yoshida et al. | |
| 6,498,702 B1 | 12/2002 | Shimizu et al. | |
| 6,531,232 B1 | 3/2003 | Baleras et al. | |
| 6,618,225 B2 | 9/2003 | Shimizu | |

(Continued)

FOREIGN PATENT DOCUMENTS

| | | |
|---|---|---|
| JP | 10241133 A | 9/1998 |
| JP | 2000223815 | 8/2000 |

(Continued)

OTHER PUBLICATIONS

International Search Report dated Mar. 13, 2008 for International Application No. PCT/US07/21952.

(Continued)

*Primary Examiner* — Thiem Phan
(74) *Attorney, Agent, or Firm* — Sughrue Mion, PLLC

(57) ABSTRACT

A substrate for mounting a preamp chip thereupon, fabricated using a stiffener layer made of a conductive material; an insulating layer provided over the circuitry area of the substrate; a circuitry made of a conductive material provided over the insulating layer; and a flap which is an extension of the stiffener layer having no insulating layer provided thereupon. The flap is fabricated to fold over the preamp chip to remove heat therefrom.

3 Claims, 8 Drawing Sheets

U.S. PATENT DOCUMENTS

| | | |
|---|---|---|
| 6,635,956 B2 | 10/2003 | Sakamoto et al. |
| 6,784,536 B1 | 8/2004 | Eslamy |
| 6,992,864 B2 | 1/2006 | Kaneko et al. |
| 2002/0149881 A1 | 10/2002 | Shimizu |
| 2003/0053255 A1 | 3/2003 | Shimizu et al. |
| 2004/0179306 A1 | 9/2004 | Kaneko et al. |
| 2004/0245619 A1 | 12/2004 | Takeuchi et al. |
| 2005/0013055 A1 | 1/2005 | Ho et al. |
| 2007/0077686 A1 | 4/2007 | Hu |

FOREIGN PATENT DOCUMENTS

| | | |
|---|---|---|
| JP | 2000311324 | 11/2000 |
| JP | 2002312914 | 10/2002 |
| JP | 2002319781 | 10/2002 |
| JP | 2004128418 | 4/2004 |
| JP | 2004363331 A | 12/2004 |

OTHER PUBLICATIONS

Gilleo, Dr. K., et al., "Materials and Processes for MR and GMR Heads and Assemblies," pp. 1-10.

United States Office Action corresponding to U.S. Appl. No. 11/548,681, dated Jan. 14, 2010.

United States Office Action corresponding to U.S. Appl. No. 11/548,681, dated Jun. 29, 2010.

Japanese Office Action corresponding to Application No. 2009532457, dated May 24, 2011.

Notification of Reasons for Refusal dated Feb. 13, 2012 in Japanese Patent Application No. 2009-532457.

* cited by examiner

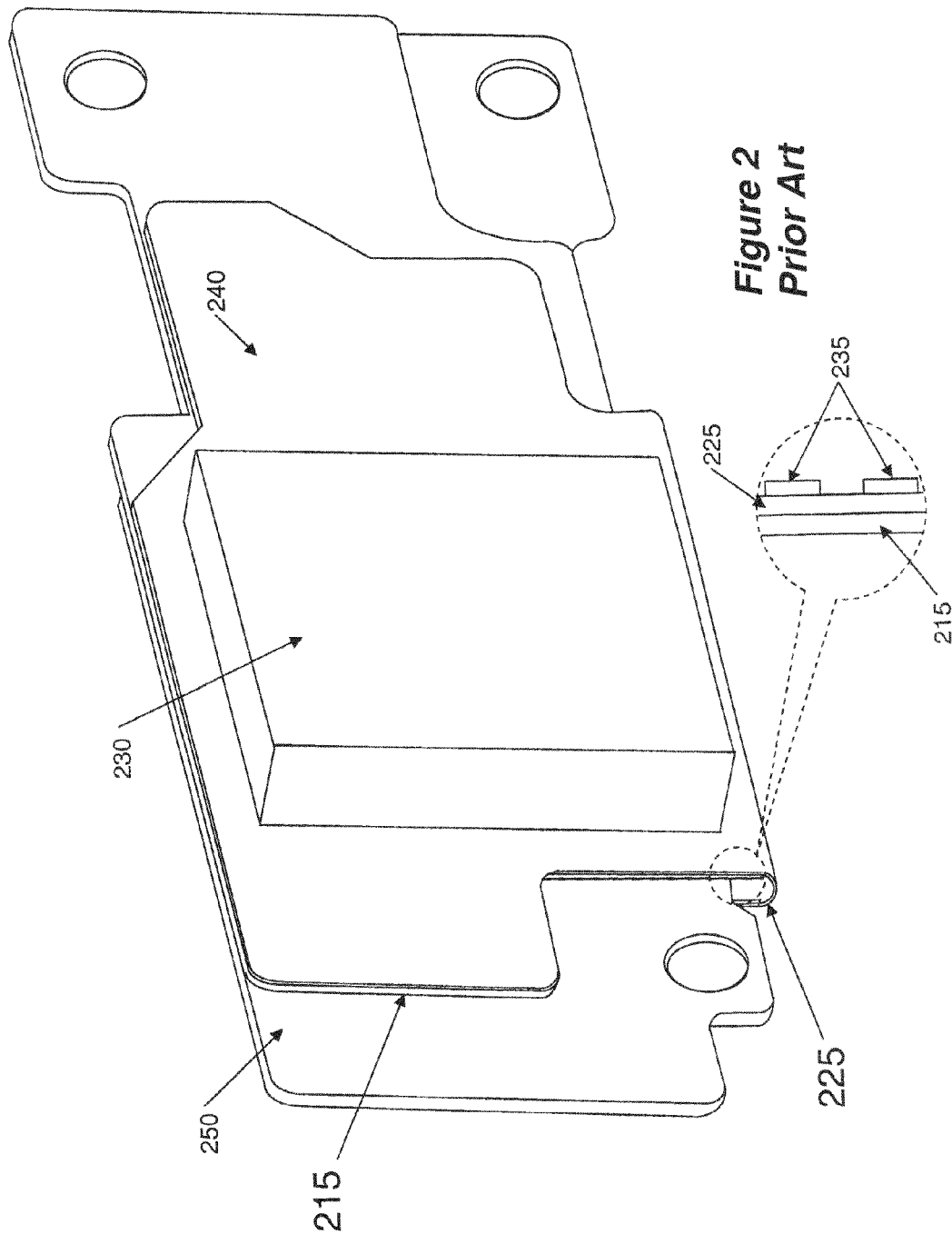

METHOD FOR MANUFACTURING A SUBSTRATE SUPPORTING AN INTEGRATED CIRCUIT CHIP

CROSS-REFERENCES TO RELATED PATENT APPLICATIONS

This is a Divisional Application of U.S. application Ser. No. 13/214,120 filed Aug. 19, 2011, which is a Continuation Application of application Ser. No. 11/548,681, filed Oct. 11, 2006 the disclosures of which are incorporated herein in their entirety by reference.

BACKGROUND

1. Field of the Invention

The subject invention relates to hard drives and, more particularly for controlling the heat generated by the hard disk drive heads preamp.

2. Related Art

FIG. 1a depicts a prior art hard drive 100 with the cover removed, while FIG. 1b depicts an enlarged image of the preamp area. The hard disk 100 uses rotating platters (disks) 110 to store data. Each platter is rotated by a spindle (not shown) and has a smooth magnetic surface on which digital data is stored. Information is written to the disk by applying a magnetic field from a read-write head (not shown) that is attached to an actuator arm 120. For reading, the read-write head detects the magnetic flux emanating from the magnetic bits that were written onto the platter. Since the signals from the read/write head is very faint, a preamp 130 is provided in close proximity to the head. The preamp 130 is a chip that is mounted on a substrate 140. The substrate 140 is mounted onto a carrier plate 150, that connects to the actuator arm assembly 120. The flexible circuit loop 160 is connected to the substrate 140, to transfer signals between the preamp 130 and the associated electronics (not shown). The associated electronics control the movement of the actuator and the rotation of the disk, and perform reads and writes on demand from the disk controller.

FIG. 2 depicts a prior art preamp sub-assembly, showing a carrier plate 250, upon which the substrate 240 is mounted. The preamp 230 is attached to the substrate 240 and makes electrical connections to tap points on the substrate 240. As shown in the cross-section inside the broken-line callout, the substrate is generally made of a stainless steel or aluminum backing, generally referred to as a stiffener, 215, an insulating polyimide layer 225, and copper conducting contacts and lines 235. The "legs" of the preamp chip 230 (or bumps in case of a flip chip) are soldered to the copper contacts 235. In the case depicted, substrate 240, having its own stiffener 215, folds back a top carrier plate 250. Carrier plate 250 and stiffener 215 can be made from a common metal layer. Alternate designs integrate the function of the carrier plate into the stiffener, eliminating the need for the carrier plate. The substrate is generally made using a sheet of stiffener material, upon which several substrates are formed, as illustrated in FIG. 3. As depicted in FIG. 3, a sheet of stiffener material, such as stainless steel or aluminum, 315, serves as a starting material for fabricating the substrate 345. For each substrate 345, a polyimide layer 325 is deposited on top of the stiffener 315 to serve as an electrical insulator. On top of the polyimide various conductive elements 335 are deposited to form contacts and transmission lines. The fabrication of these layers is done using conventional photolithography techniques. Both subtractive and additive flexible circuit fabrication processes are commonly employed in hard disk drives. To maximize the available real estate, the substrates 345 are fabricated so as to "nest" with each other, and after the fabrication is completed the substrates 345 are cut out of the stiffener sheet 315.

As the physical size of the hard drive decrease, the heat generated by the preamp affects performance and reliability of the hard drive.

SUMMARY

The present invention has been made by observing a problem in the prior art, in that the heat generated by the preamp is not readily dissipated. While the carrier arm 250 can be used as a heat sink, the inventors of the subject application have discovered that little heat passes from the preamp 230 to the carrier arm 250. The inventors have postulated that the reason for the low heat transfer is that the polyimide layer 225 of the substrate 240 acts as a heat barrier. Notably, polyimide has a thermal conductivity of 0.12 W/m-K, which is thermally insulative. Additionally, conductive pads 235 provide a very limited conductive heat release means, and suffer as well from the thermal isolation of the polyimide layer. Accordingly, the inventors have invented schemes to better remove heat from the preamp by providing a thermal conduit from the top of the preamp to the carrier arm.

According to an aspect of the invention, a substrate for mounting a preamp chip thereupon is provided, comprising a stiffener layer made of first conductive material; an insulating layer provided over circuitry area of the substrate; a circuitry of a second conductive material provided over the insulating layer; and a flap comprising an extension of the stiffener layer having no insulating layer provided thereupon, and wherein the flap is fabricated to fold over the preamp chip. According to one aspect, the first conductive material comprises stainless steel or aluminum. According to another aspect, the second conductive material comprises copper. The flap may comprise fins. The flap may also comprise cutout configured for injective adhesive thereupon.

According to another aspect of the invention, an actuator assembly for a hard disk drive is provided, comprising: an actuator arm; a circuitry substrate mounted onto the arm; a preamp chip mounted onto the circuitry substrate; and, wherein the substrate comprises a flap folded over top of the preamp ship. The substrate may comprises: a stiffener layer made of first conductive material; an insulating layer provided over circuitry area of the substrate; a circuitry of a second conductive material provided over the insulating layer; and, wherein the flap comprises an extension of the stiffener layer having no insulating layer provided thereupon. An adhesive may be provided between the preamp chip and the flap. The flap may comprise a cutout for an adhesive injected via the cutout. The adhesive may comprise a heat conducting epoxy. The flap may comprise fins.

According to yet another aspect of the invention, a method for manufacturing a substrate for supporting an integrated circuit chip thereupon is provided, comprising: providing a sheet of stiffener comprising a first conductive material; providing an insulating layer on defined sections of the stiffener, each section defining a circuitry area of one substrate; providing contacts on the insulating layer, the contacts made of a second conductive material; and, cutting each substrate out of the sheet according to a designed outline, the designed outlined comprising the circuitry area and a flap, the flap comprising a section of the sheet of stiffener having no insulating layer thereupon. The method may also comprise cutting a cutout in the flap.

According to a further aspect of the invention, a method for manufacturing a preamp assembly for a hard drive is provided, comprising: providing a substrate, the substrate comprising a stiffener conductive layer, an insulating layer provided on the stiffener and defining a circuitry area, and a plurality of contacts provided on the insulating layer, and a flap comprising a section of the stiffener having no insulating layer thereupon; mounting the preamp on the circuitry area of the substrate so as to form electrical connection to at least some of the contacts; and folding the flap over the preamp. The method may further comprise injective adhesive between the preamp and the flap. The flap may comprise a cutout and the method may further comprise injecting adhesive onto the cutout.

BRIEF DESCRIPTION OF THE DRAWINGS

Other aspects and features of the invention would be apparent from the detailed description, which is made with reference to the following drawings. It should be appreciated that the detailed description and the drawings provide various non-limiting examples of various embodiments of the invention, which is defined by the appended claims.

FIG. 1a depicts a prior art hard drive 100 with the cover removed, while

FIG. 2 depicts a prior art preamp subassembly.

FIG. 7a depicts the resulting temperature distribution in the preamp for the prior art assembly without the flap, while

FIG. 8a depicts a finite element simulation run of the model with the flap, but without the epoxy, while

DETAILED DESCRIPTION

Figure 4:
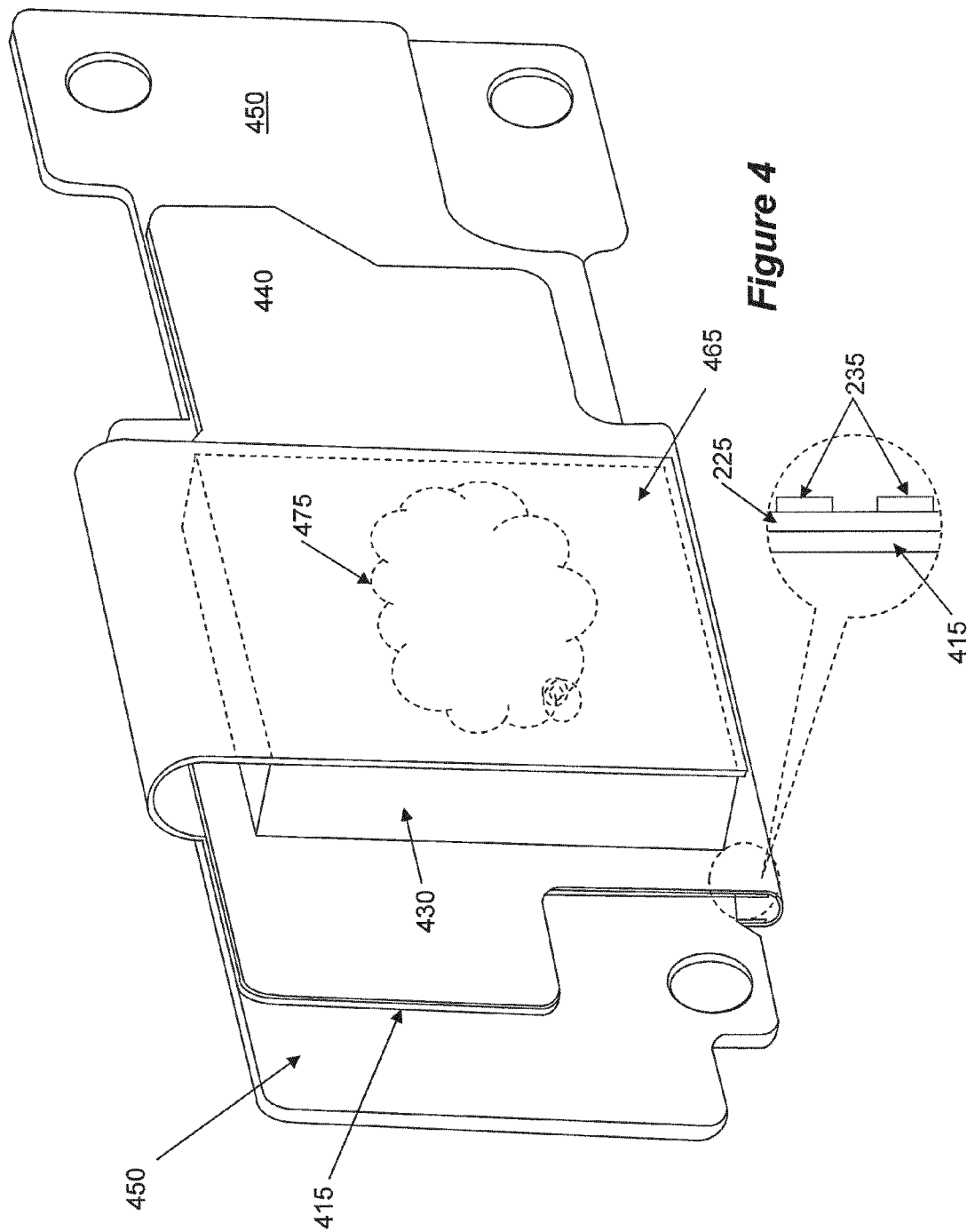
FIG. 4 depicts a preamp subassembly with a substrate according to an embodiment of the invention.

FIG. 4 depicts a preamp subassembly showing carrier plate 450 with a substrate 440 according to an embodiment of the invention. Notably, a flap 465 of stiffener material has been added to the fabrication of the substrate 440. The flap 465 is folded over the preamp 430, so as to remove heat from the top of the preamp 430. The heat removed is conducted by the flap 465 to stiffener 415, then to carrier plate 450 and to the actuator arm assembly (not shown), which acts as the conduction heat sink.

That is, as can be understood from FIG. 2, the stiffener layer 215 of the substrate 240 is in physical contact with the carrier plate 250. However, as noted above in the prior art, the heat from the preamp 230 is not conducted to the carrier plate 250 because the polyimide layer 225 of the substrate 240 acts as a barrier for heat conduction. On the other hand, the flap 465 of the embodiment of FIG. 4 has no polyimide deposited thereupon. Consequently, heat from the top of the preamp 430 can be easily conducted to the flap 465. Since the flap 465 is fabricated as an integral part of the substrate 440, the heat from the flap 465 is easily conducted onto the carrier plate 450. Convective heat transfer also takes place from the exposed surface area of the flap 465 to ambient air.

Figure 5:
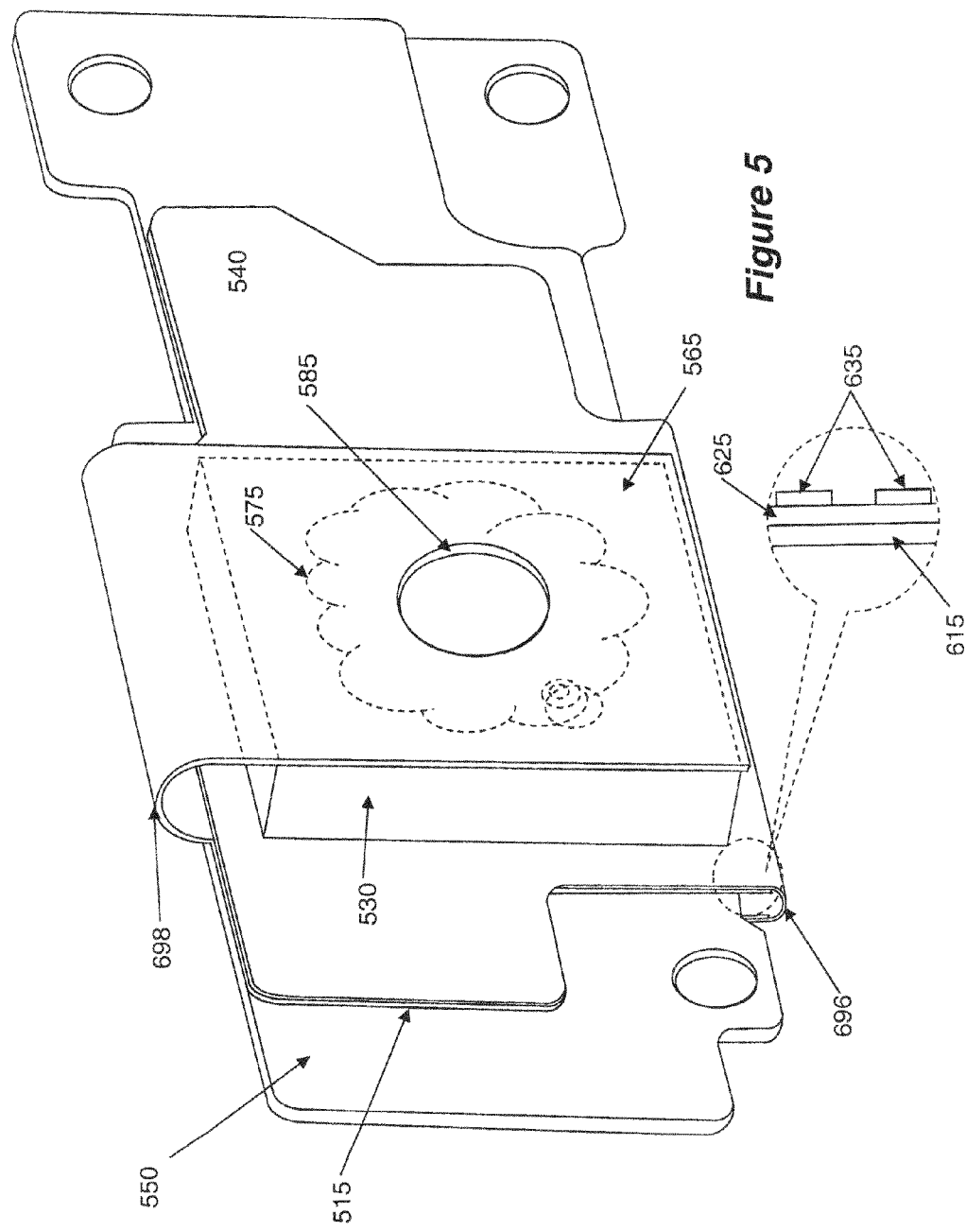
FIG. 5 depicts a preamp subassembly with a substrate according to another embodiment of the invention.

To further improve heat conductance to the flap, optionally a conductive adhesive 475 can be provided between the preamp 430 and the flap 465, as is illustrated by the broken-line callout 475. In practice, an air gap between flap 465 and 430 may exist due to geometric tolerances and forming uncertainties, so the conductive adhesive 475 is useful in filling that poor conductive path. On the other hand, to ease assembly of the preamp and substrate, in FIG. 5 a cut-out 585 has been made in the flap 565. In this embodiment, once the preamp 530 is attached to the substrate 540, the flap 565 is folded over the preamp, as shown in FIG. 5. Then a conductive adhesive is injected into the cutout 585, so as to spread under the flap 565 and onto the preamp 530, as is illustrated by broken-line callout 575.

Figure 1A:
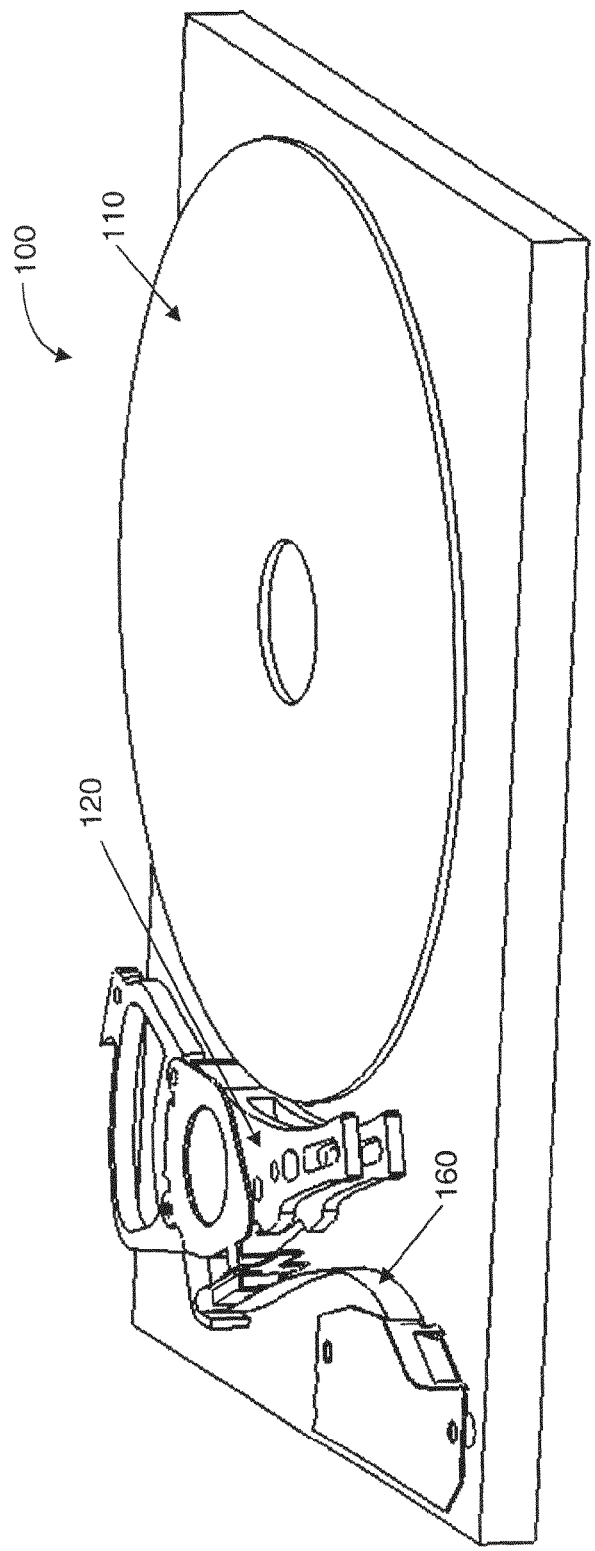
Figure 1B:
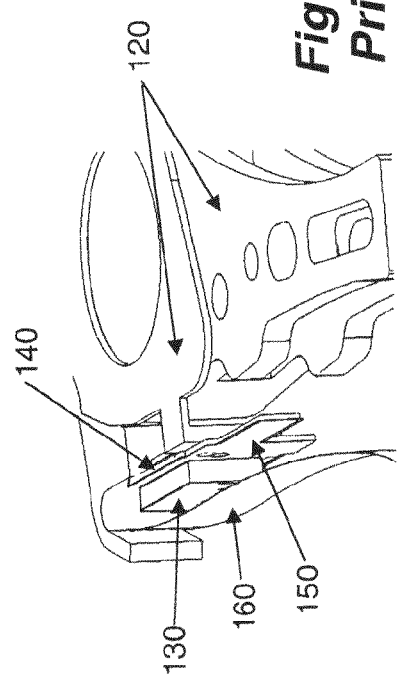
FIG. 1b depicts an enlarged image of the preamp area.
Figures 3, 6:
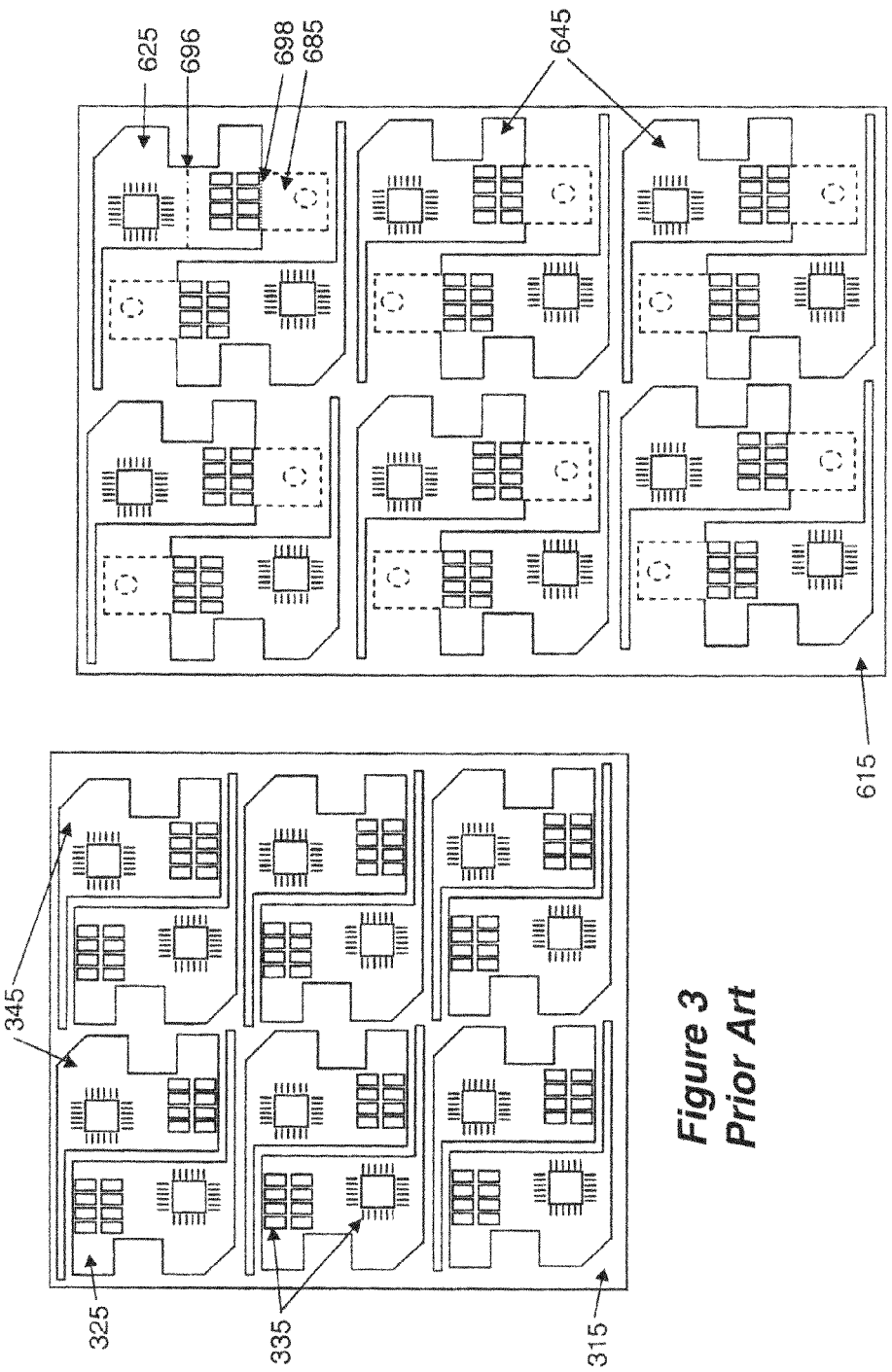
FIG. 3 depicts a sheet of stiffener having several substrates fabricated thereupon.
FIG. 6 illustrates a sheet of stiffener having several substrates fabricated thereupon according to an embodiment of the invention.

FIG. 6 illustrates a sheet of stiffener having several substrates fabricated thereupon according to an embodiment of the invention. In FIG. 6, the starting material is a sheet of stiffener material, such as stainless steel 615. Several substrates 645 are fabricated on sheet 615 in a nested arrangement. Each substrate 645 has a "circuit" region, defined by the polyimide layer 625 and shown in solid line, and a flap 685, which is a differently processed area of the stainless steel. That is, flap 685 is not covered with a polyimide, but is rather bare stiffener material. When the substrate is cut out of the sheet material, the cut is made so that the flap is an integral part of the substrate. This ensures that heat conducted onto the flap would be immediately conducted to the entire stiffener layer of the substrate. Since the stiffener contacts the carrier plate, the heat would be conducted to it and to the actuator arm assembly, which acts as a heat sink.

During assembly, preamp 530 is attached to the substrate 645, substrate 645 is folded along dash-dotted line 696 so as to mate carrier plate 550 and stiffener 515, as shown in FIG. 5. Incidentally, as shown in FIG. 5, in this embodiment at the area of fold 696 there is no stiffener material, but rather only a polyimide layer. The flap 685 is then folded along dotted line 698 over the preamp 530. Then, when a cutout is used, conductive adhesive is injected into cutout 585. When no cutout is provided, the adhesive may be injected from the sides, or injected prior to folding the flap over the preamp. One type of adhesive that is suitable for use with the embodiments described herein is TIGA HTR-815 epoxy, available from Resin Technology Group of South Easton, Mass. This epoxy has thermal conductivity of 1.15 W/m-K, which is an order of magnitude higher than the polyimide.

Figure 7A:
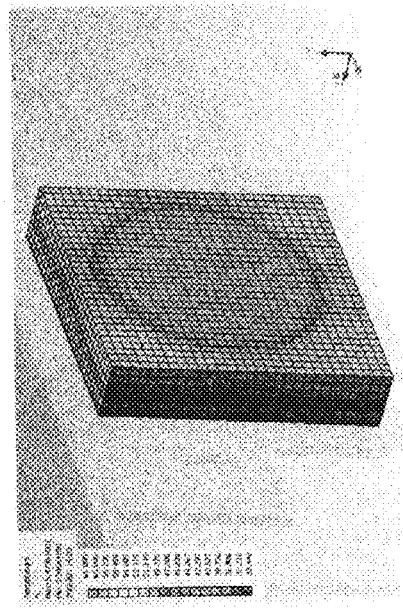
Figure 7B:
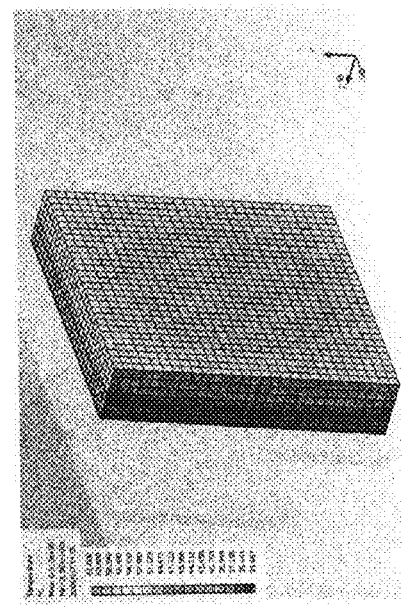
FIG. 7b depicts the temperature distribution in the chip with the flap according to the embodiment of FIG. 5.

The embodiment depicted in FIG. 5 has been entered into a free convection thermal finite element simulation (hereon referred to as model) assuming a 25° C. ambient temperature and a fixed self heat generation magnitude in the preamp chip volume. The model was run assuming a fixed film coefficient for all exposed surfaces of the chip and surrounding subassembly bodies, allowing heat transfer to the ambient air by convection. For the first run, the exposed surfaces were set to have a film coefficient of 1 $e^{-4}$ W/mm$^2$-K and the preamp self heat generation magnitude assumed was 0.05 W/mm$^3$, or 250 mW. FIG. 7a depicts the resulting temperature distribution in the preamp for the prior art assembly without the flap, while FIG. 7b depicts the temperature distribution in the chip with the flap according to the embodiment of FIG. 5. For illustration purposes, the surrounding structures are hidden in FIGS. 7a and 7b. The maximum temperature observed in FIG. 7a was 60.1° C., while for FIG. 7b with the flap it was 54.7° C. Additionally, without the flap, a large area of high temperature was observed on the preamp with the gradient increasing towards the center of the preamp, while with the flap, the center of the preamp was cooler than the edges, tending to show that heat is conducted to the flap via the epoxy. Therefore, it is believed that large coverage of epoxy over the preamp would lead to improved results.

The model was also run with the exposed surfaces set to have film coefficient of $2.0\ e^{-4}$ W/mm²-K and the same heat generation magnitude. For this case the maximum observed preamp temperature was 52.0° C. without the flap and 47.1° C. with the flap. This tends to show that even when improved convection to ambient air is present, the flap still provides the benefits of heat removal from the chip.

Figure 8A:
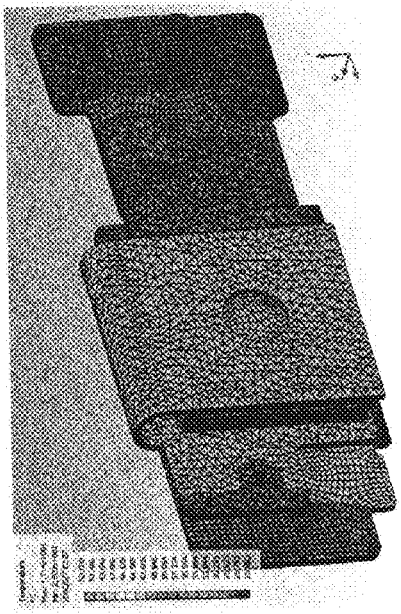
Figure 8B:
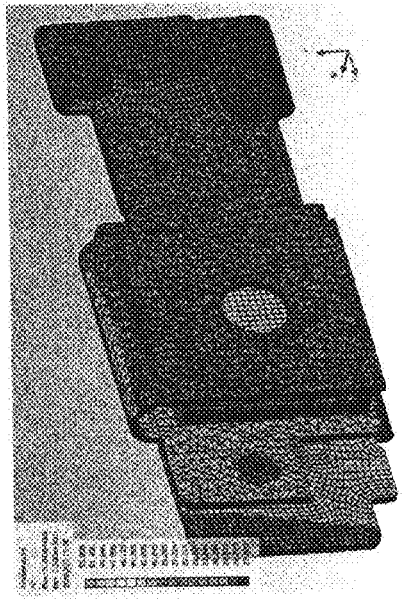
FIG. 8b depicts a run of the model with the flap and epoxy.

FIG. 8*a* depicts a run of the model in FIG. 5 with the flap, but without the epoxy, while FIG. 8*b* depicts a run of the model with the flap and epoxy. As can be seen from FIG. 8*a*, there is poor thermal conductivity between the preamp and the flap due to an air gap placed intentionally between them, when no epoxy is present. This exemplifies the prior art configuration to an extent, because heat is not being removed from the top of the chip. On the other hand, the center of the preamp is cooler at the center when the epoxy is added. Both the maximum chip temperature and average temperature within the chip volume, are reduced. Consequently, it can be seen that if no epoxy is provided, physical contact between the flap and the preamp must be assured, which may increase manufacturing tolerances. The epoxy enables relaxing these tolerances and ease manufacturing.

Figure 9:
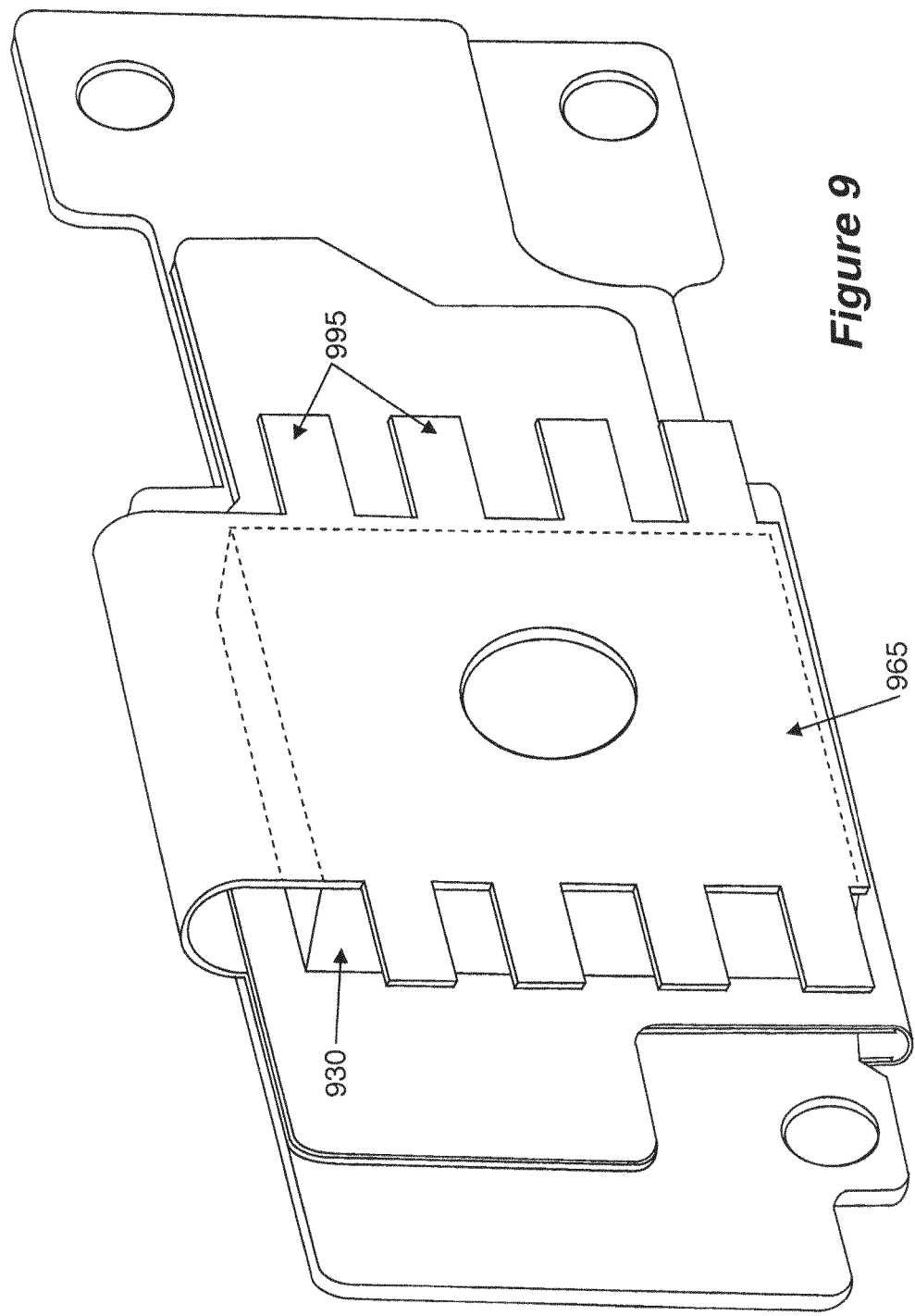
FIG. 9 depicts another embodiment of the invention.

Another embodiment is depicted in FIG. 9. In FIG. 9, heat removal from the preamp 930 is enhanced by adding fins 995 to the flap 965. In this manner, heat is dissipated from the preamp to the flap, and from the flap to the carrier plate by conduction and to the ambient atmosphere via enhanced convection from the fins. Of course, other designs of fins can be made and those shown in FIG. 9 are provided only as one example.

Figure 10:
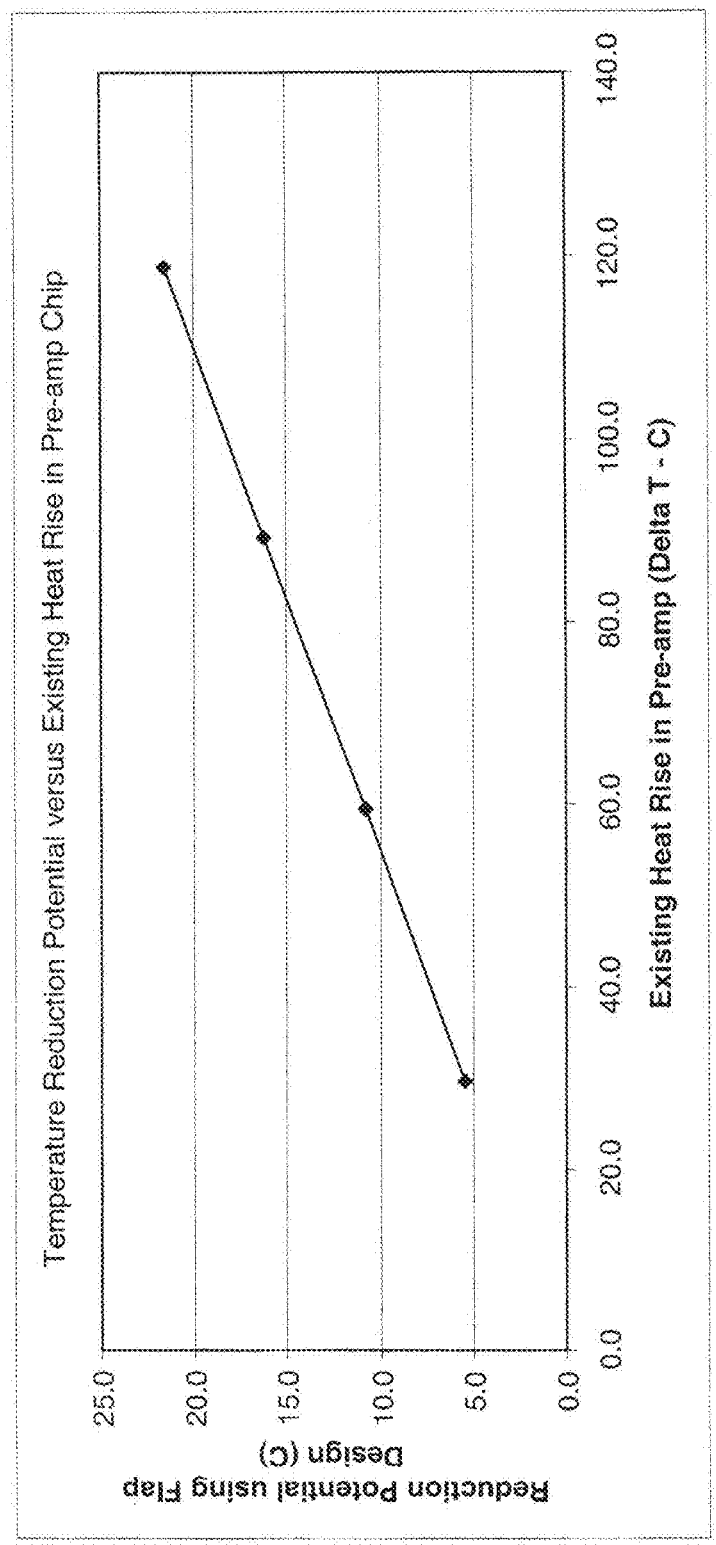
FIG. 10 is a plot depicting simulated temperature reductions due to the flap design versus heat rise in the preamp chip.

FIG. 10 is a plot depicting expected temperature reduction due to the flap design versus heat rise in the preamp chip. To simulate this trend, the preamp heat generation is varied from 0.05 to 0.2 W/mm³. It is shown, as the observed heat differential rises in the chip, the benefit provided by the flap increases. For example, for a chip that operates at about 35 degrees above ambient, the flap should provide a reduction of 5 degrees, as opposed to a design without a flap. On the other hand, a more typical chip operating temperature is about 100 degrees above ambient, for which the flap is expected to provide over 15 degrees reduction in maximum temperature.

Thus, while only certain embodiments of the invention have been specifically described herein, it will be apparent that numerous modifications may be made thereto without departing from the spirit and scope of the invention. Further, certain terms have been used interchangeably merely to enhance the readability of the specification and claims. It should be noted that this is not intended to lessen the generality of the terms used and they should not be construed to restrict the scope of the claims to the embodiments described therein.

What is claimed is:

1. A method for manufacturing a substrate for supporting an integrated circuit chip thereupon, comprising:
   providing a sheet of stiffener comprising a first conductive material;
   providing an insulating layer on defined sections of the stiffener, each section defining a circuitry area of one substrate;
   providing contacts on the insulating layer, the contacts made of a second conductive material;
   cutting each substrate out of the sheet according to a designed outline, the designed outline comprising the circuitry area and a flap, the flap comprising a section of the sheet of stiffener having no insulating layer thereupon and a cutout;
   mounting an integrated circuit chip on the circuitry area of the substrate so as to form an electrical connection to at least some of the contacts;
   folding the flap over the integrated circuit chip; and
   injecting adhesive into the cutout.

2. The method of claim 1, wherein the adhesive is provided between the integrated circuit chip and the flap.

3. The method of claim 1, wherein the adhesive is a heat conducting epoxy.

\* \* \* \* \*